(12) United States Patent
Takada

(10) Patent No.: US 12,315,823 B2
(45) Date of Patent: May 27, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yoshiharu Takada, Nonoichi Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 400 days.

(21) Appl. No.: 17/691,792

(22) Filed: Mar. 10, 2022

(65) Prior Publication Data

US 2023/0078429 A1 Mar. 16, 2023

(30) Foreign Application Priority Data

Sep. 15, 2021 (JP) .................................. 2021-150488

(51) Int. Cl.
*H01L 23/544* (2006.01)
*H01L 23/00* (2006.01)

(52) U.S. Cl.
CPC ............ *H01L 23/544* (2013.01); *H01L 24/16* (2013.01); *H01L 2223/54426* (2013.01);
(Continued)

(58) Field of Classification Search
None
See application file for complete search history.

(56) References Cited

U.S. PATENT DOCUMENTS

2003/0042525 A1 3/2003 Tanaka
2020/0266129 A1* 8/2020 Higashi ................. H01L 21/565

FOREIGN PATENT DOCUMENTS

CN 101252114 A * 8/2008 ............. H01L 23/31
JP S61016555 A 1/1986
(Continued)

OTHER PUBLICATIONS

Japanese Office Action (and an English language translation thereof) dated Sep. 27, 2024, issued in counterpart Japanese Application No. 2021-150488.

*Primary Examiner* — Hung K Vu
(74) *Attorney, Agent, or Firm* — Holtz, Holtz & Volek PC

(57) ABSTRACT

A semiconductor device includes a semiconductor chip and a metal plate. The semiconductor chip has first and second surfaces, four side surface, four corners, four sides. The four side surfaces connect the first surface and the second surface. Two of the four side surfaces contact each other at one of the four corners. The four side surfaces contact the second surface at the four sides. The first and second electrodes are provided at the first front side. The metal plate is connected to the second surface side of the semiconductor chip. The metal plate includes third and fourth surfaces, and a through-hole or a notch. The third surface is connected to the second surface of the semiconductor chip. The fourth surface is provided at a side opposite to the third surface. The through-hole or the notch extends through the metal plate from the fourth surface to the third surface.

18 Claims, 9 Drawing Sheets

(52) U.S. Cl.
CPC ............... *H01L 2224/10135* (2013.01); *H01L 2224/16227* (2013.01); *H01L 2924/13091* (2013.01)

(56) References Cited

FOREIGN PATENT DOCUMENTS

| | | |
|---|---|---|
| JP | H05326815 A | 12/1993 |
| JP | H06283629 A | 10/1994 |
| JP | H11150213 A | 6/1999 |
| JP | 2003069019 A | 3/2003 |
| JP | 2007005601 A | 1/2007 |
| JP | 2007250868 A | 9/2007 |
| JP | 2017112153 A | 6/2017 |

* cited by examiner

SEMICONDUCTOR DEVICE

CROSS-REFERENCE TO RELATED APPLICATIONS

This application is based upon and claims the benefit of priority from Japanese Patent Application No. 2021-150488, filed on Sep. 15, 2021; the entire contents of which are incorporated herein by reference.

FIELD

Embodiments relate to a semiconductor device.

BACKGROUND

In so-called flip-chip bonding, electrodes provided at the front side of a semiconductor chip are connected to a mount pad on a mounting substrate. The semiconductor chip is aligned on the mount pad of the mounting substrate by using the back surface of the semiconductor chip as a reference. However, it is difficult to align the semiconductor chip with the mount pad of the mounting substrate when a metal plate that is larger than the back surface is connected to the backside of the semiconductor chip.

DETAILED DESCRIPTION

Figure 1:
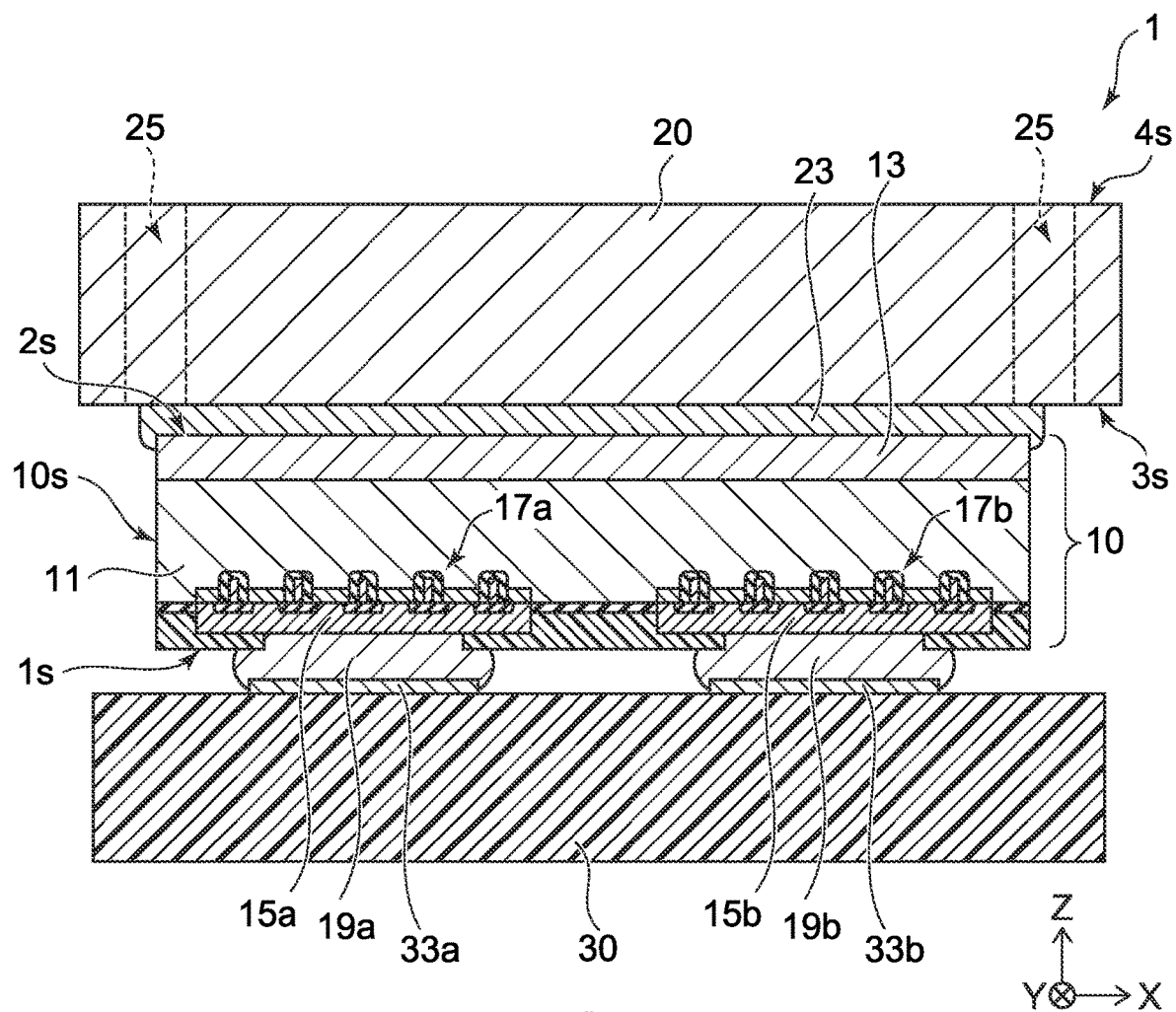
FIG. 1 is a schematic cross-sectional view showing a semiconductor device according to an embodiment.

According to one embodiment, a semiconductor device includes a semiconductor chip and a metal plate. The semiconductor chip includes first and second electrodes and a conductive layer. The semiconductor chip has a first surface, a second surface, four side surface, four corners, four sides. The second surface is provided at a side opposite to the first surface. The four side surfaces connect the first surface and the second surface. Two of the four side surfaces contact each other at one of the four corners. The four side surfaces contact the second surface at the four sides. The first and second electrodes are provided at the first front side. The conductive layer is provided on the second surface. The metal plate is connected to the second surface side of the semiconductor chip. The metal plate includes a third surface, a fourth surface, and a through-hole or a notch. The third surface is connected to the second surface of the semiconductor chip. The fourth surface is provided at a side opposite to the third surface. The through-hole or the notch extends through the metal plate from the fourth surface to the third surface.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. FIG. 1 is a cross-sectional view illustrating the semiconductor device 1 mounted on a circuit board 30.

The semiconductor device 1 includes a semiconductor chip 10 and a metal plate 20. The semiconductor chip 10 includes a first surface 1s and a second surface 2s. The second surface 2s is positioned at the side opposite to the first surface 1s. The metal plate 20 is connected to the second surface 2s of the semiconductor chip 10. The metal plate 20 includes, for example, copper.

The semiconductor chip 10 includes a semiconductor part 11, a conductive layer 13, a first electrode 15a, and a second electrode 15b. The first electrode 15a and the second electrode 15b are provided at the first surface 1s side. The conductive layer 13 is provided on the second surface 2s. The semiconductor part 11 is provided between the conductive layer 13 and the first electrode 15a and between the conductive layer 13 and the second electrode 15b. The semiconductor part 11 is, for example, silicon. The conductive layer 13 is, for example, a metal layer that includes nickel (Ni), titanium (Ti), and like. The first electrode 15a and the second electrode 15b include, for example, aluminum (Al), etc.

The semiconductor chip 10 further includes MOS gate structures 17a and 17b. The MOS gate structure 17a is provided between the semiconductor part 11 and the first electrode 15a. The MOS gate structure 17b is provided between the semiconductor part 11 and the second electrode 15b. The MOS gate structures 17a and 17b control a current that flows between the first electrode 15a and the second electrode 15b via the semiconductor part 11 and the conductive layer 13.

The metal plate 20 includes a third surface 3s and a fourth surface 4s. The third surface 3s is connected to the conductive layer 13 of the semiconductor chip 10 via a connection member 23. The connection member 23 is, for example, a solder material or a conductive paste. The fourth surface 4s is positioned at the side opposite to the third surface 3s. The metal plate 20 further includes a through-hole 25 that communicates from the fourth surface 4s to the third surface 3s.

In the semiconductor device 1, it is preferable to reduce the thickness of the semiconductor part 11 in the direction from the first surface 1s toward the second surface 2s (hereinbelow, a Z-direction) to reduce the on-resistance between the first electrode 15a and the second electrode 15b. A part of current that flows through the conductive layer 13 is increased thereby, and the on-resistance between the first electrode 15a and the second electrode 15b is reduced. When the thickness of the semiconductor part 11 is reduced, however, the semiconductor chip 10 is easily warped. The mechanical strength of the semiconductor chip 10 also decreases. Therefore, it is preferable to prevent warp and increase the mechanical strength by connecting the metal plate 20 to the second surface 2s side of the semiconductor chip 10.

As shown in FIG. 1, the semiconductor device 1 is mounted so that the first surface 1s of the semiconductor chip 10 faces the circuit board 30. The circuit board 30 includes, for example, mount pads 33a and 33b. The first electrode 15a is connected to the mount pad 33a via a connection member 19a. The second electrode 15b is connected to the mount pad 33b via a connection member 19b. The connection members 19a and 19b are, for example, solder materials.

Figure 2A:
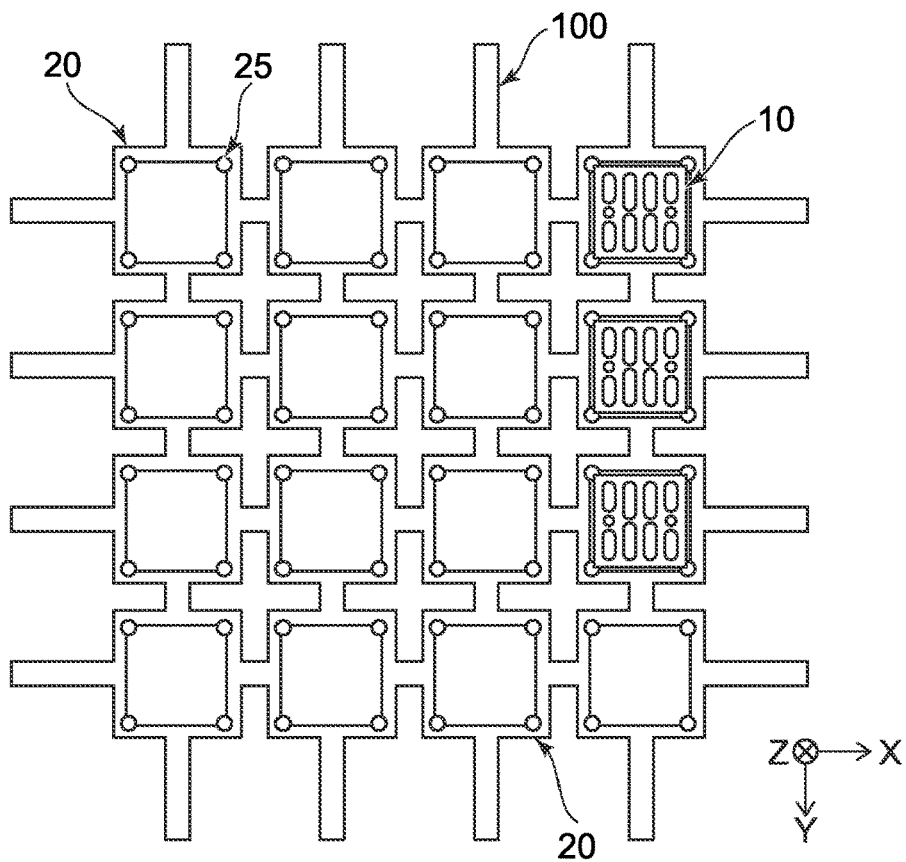
FIGS. 2A and 2B are schematic plan views showing manufacturing processes of the semiconductor device according to the embodiment.
Figure 2B:
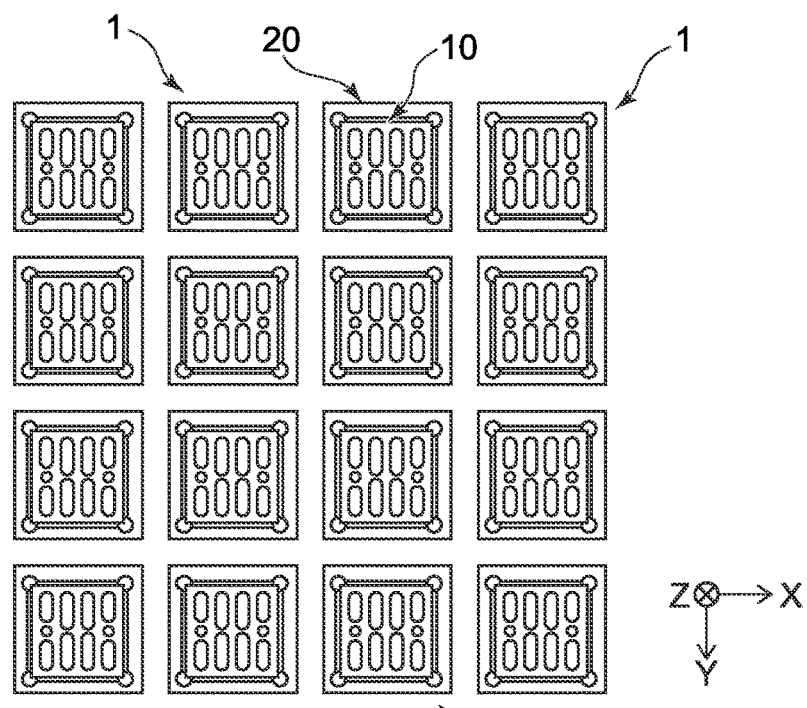

FIGS. 2A and 2B are schematic plan views showing manufacturing processes of the semiconductor device 1 according to the embodiment.

As shown in FIG. 2A, the multiple semiconductor chips 10 are mounted on a frame 100. The frame 100 includes the metal plates 20 that are connected to each other via multiple leads. The metal plates 20 each include the through-hole 25. The semiconductor chips 10 are mounted on the metal plates 20 via the connection member 23 (see FIG. 1).

When a solder material is used as the connection member 23, for example, the semiconductor chip 10 is mounted on the metal plate 20 after supplying a solder material in cream form onto the metal plate 20. The semiconductor chip 10 is placed on the metal plate 20 and closely adhered to the metal plate 20 via the solder material. Subsequently, the solder material is melted under a prescribed temperature inside an electric furnace, and then is cooled outside the electric furnace. Thereby, the semiconductor chip 10 is connected to the metal plate 20.

When a conductive paste is used as the connection member 23, for example, the semiconductor chip 10 is mounted on the metal plate 20 after supplying the conductive paste onto the metal plate 20. The semiconductor chip is placed to be closely adhered to the metal plate 20 via the conductive paste. Subsequently, the semiconductor chip 10 is connected to the metal plate 20 by curing the conductive paste under a prescribed temperature inside an oven.

Then, as shown in FIG. 2B, the multiple semiconductor devices 1 are singulated by cutting the leads that connect the metal plates 20 that are next to each other. The leads of the frame 100 are cut using, for example, a dicing blade.

Figure 3A:
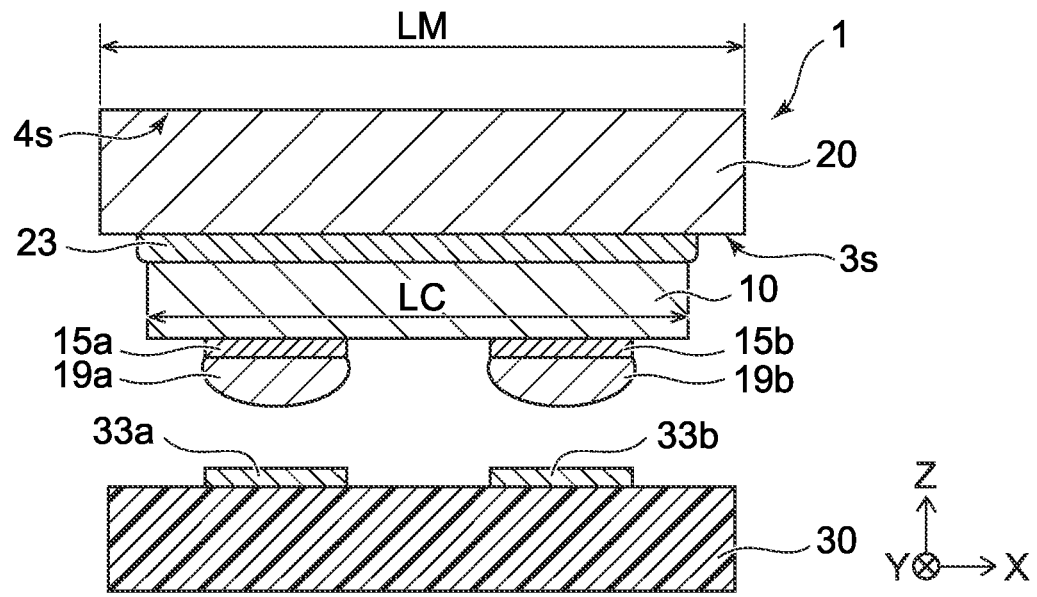
FIGS. 3A and 3B are schematic cross-sectional views showing a mounting process of the semiconductor device according to the embodiment.
Figure 3B:
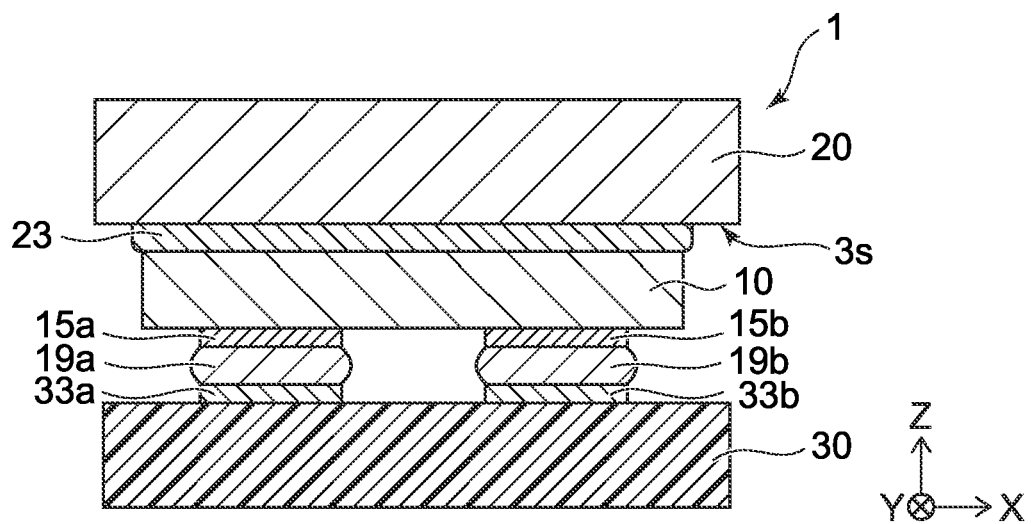

FIGS. 3A and 3B are schematic cross-sectional views showing a mounting process of the semiconductor device 1 according to the embodiment. The semiconductor device 1 is flip-chip bonded on the circuit board 30.

As shown in FIG. 3A, the semiconductor device 1 is aligned above the mount pads 33a and 33b of the circuit board 30. The circuit board 30 is heated to a prescribed temperature. On the other hand, the connection member 19a and the connection member 19b are provided on the first and second electrodes 15a and 15b. The connection members 19a and 19b are provided respectively on the first and second electrodes 15a and 15b, for example, in the final stage of the manufacturing processes of the semiconductor chip 10.

As shown in FIG. 3B, the semiconductor device 1 is compression-bonded to the circuit board 30. The first electrode 15a is connected to the mount pad 33a via the connection member 19a. The second electrode 15b is connected to the mount pad 33b via the connection member 19b.

As shown in FIG. 3A, a size LM in the X-direction of the metal plate 20 is greater than a size LC in the X-direction of the semiconductor chip 10. This is similar for the size in the Y-direction of the metal plate 20 (see FIG. 2B). When the metal plate 20 does not include the through-hole 25, for example, the semiconductor chip 10 is not visible at the fourth surface 4s side of the metal plate 20. Accordingly, the semiconductor device 1 is aligned by aligning the outer edge of the metal plate 20 with an alignment pattern on the circuit board 30. When the precision of the relative position between the semiconductor chip 10 and the metal plate 20 is less than the desirable alignment precision between the first electrode 15a and the mount pad 33a and between the second electrode 15b and the mount pad 33b, there may be a case where the first electrode 15a and the second electrode 15b cannot be suitably connected to the mount pads 33a and 33b. In other words, misalignment of the semiconductor chip 10 occurs with respect to the circuit board 30.

Figure 4A:
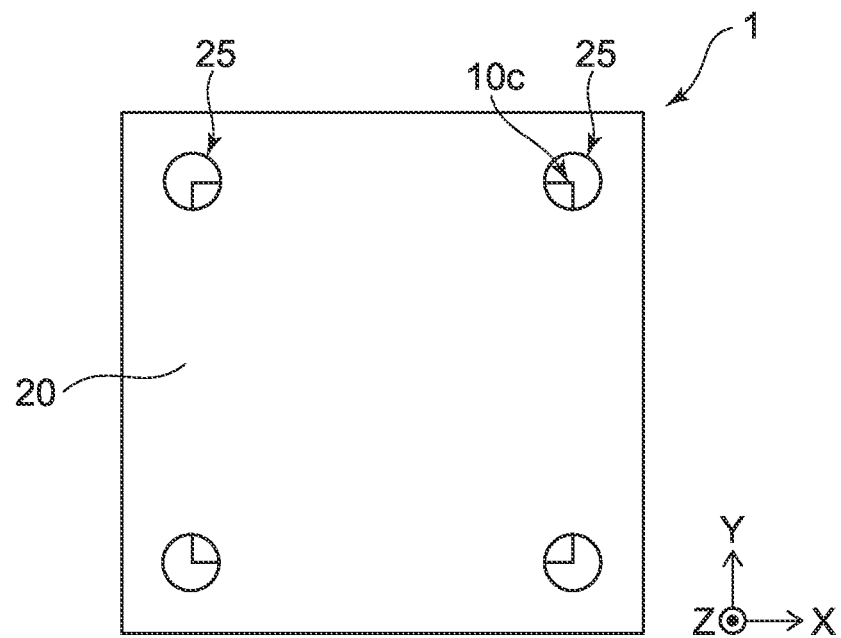
FIGS. 4A and 4B are schematic plan views showing the semiconductor device according to the embodiment.
Figure 4B:
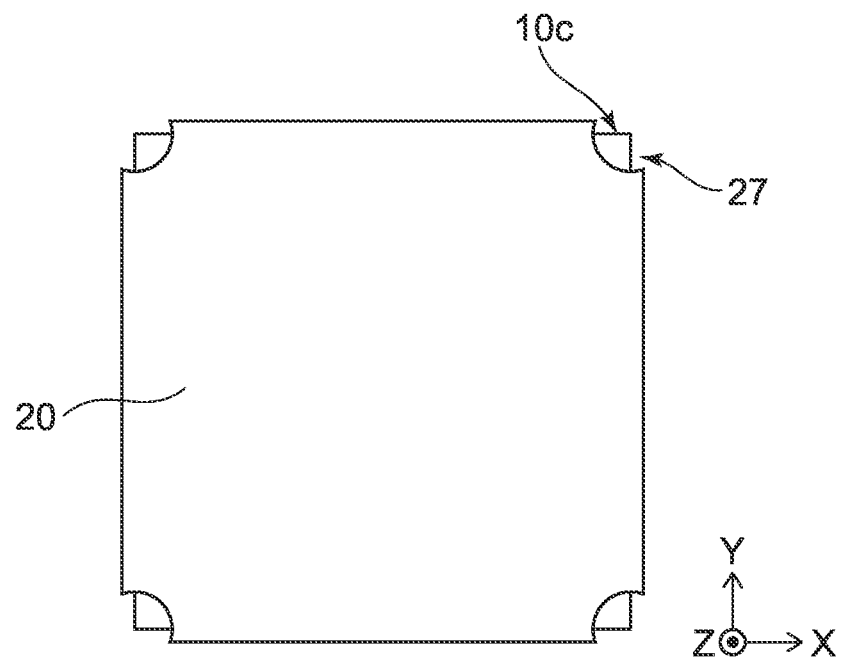

FIGS. 4A and 4B are schematic plan views showing the semiconductor device 1 according to the embodiment. FIGS. 4A and 4B illustrate the semiconductor device 1 viewed in the fourth surface 4s side of the metal plate 20.

The first and second surfaces 1s and 2s of the semiconductor chip 10 have, for example, square shapes (see FIG. 2B). The semiconductor chip 10 includes four side surfaces 10s that are connected to the first and second surfaces 1s and 2s (see FIG. 1). For example, the planar shape of the metal plate 20 also is square (see FIG. 2B).

As shown in FIG. 4A, the metal plate 20 includes the through-holes 25 that are located respectively at the four corners. The semiconductor chip 10 includes a corner 10c at which two of the four side surfaces 10s are connected. The metal plate 20 is provided so that the corners 10c of the semiconductor chip 10 are visible via the through-holes 25 at the fourth surface 4s side. Thereby, when aligning the semiconductor device 1 above the circuit board 30 (see FIG. 3A), the position of the semiconductor chip 10 can be directly aligned with respect to the circuit board 30. Accordingly, it is possible to prevent the semiconductor chip 10 from the misalignment with respect to the circuit board 30.

As shown in FIG. 4B, the metal plate 20 includes notches 27 located respectively at the four corners. In this example, the notch 27 are provided instead of the through-hole 25. The metal plate 20 is provided so that the corners 10c of the semiconductor chip 10 are visible via the notches 27 at the fourth surface 4s side. Thereby, it is possible to prevent the semiconductor chip 10 from the misalignment with respect to the circuit board 30.

FIGS. 5A to 5D are schematic plan views showing the semiconductor device 1 according to a modification of the embodiment. FIGS. 5A to 5D illustrate the semiconductor device 1 viewed in the fourth surface 4s side of the metal plate 20.

Figure 5A:
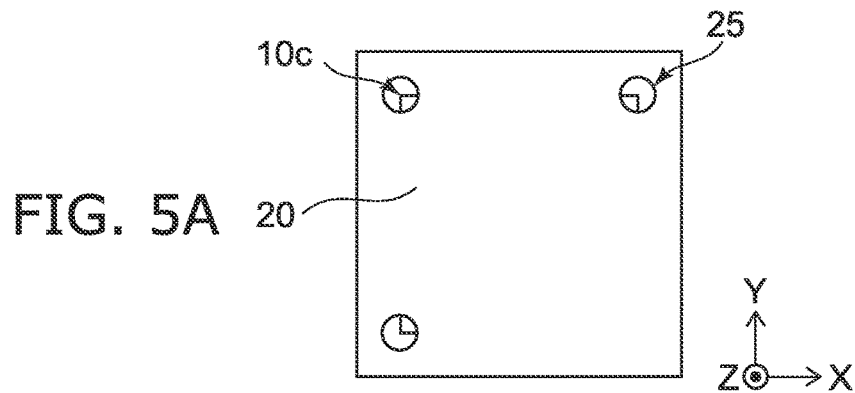
FIGS. 5A to 5D are schematic plan views showing the semiconductor device according to a modification of the embodiment.

As shown in FIG. 5A, the metal plate 20 includes the through-holes 25 located respectively at three of the four corners of the fourth surface 4s. The metal plate 20 is provided so that the three corners 10c of the semiconductor chip 10 are visible at the fourth surface 4s side via the through-holes 25.

Figure 5B:
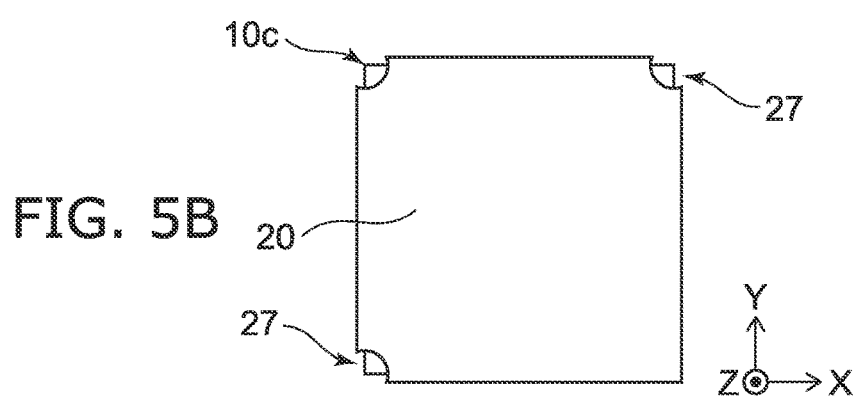

As shown in FIG. 5B, the metal plate 20 includes the notches 27 that are provided instead of the through-holes 25 at the three corners of the fourth surface 4s. The metal plate 20 is located so that three of the four corners 10c of the semiconductor chip 10 are visible from the fourth surface 4s side via the notches 27.

Figure 5C:
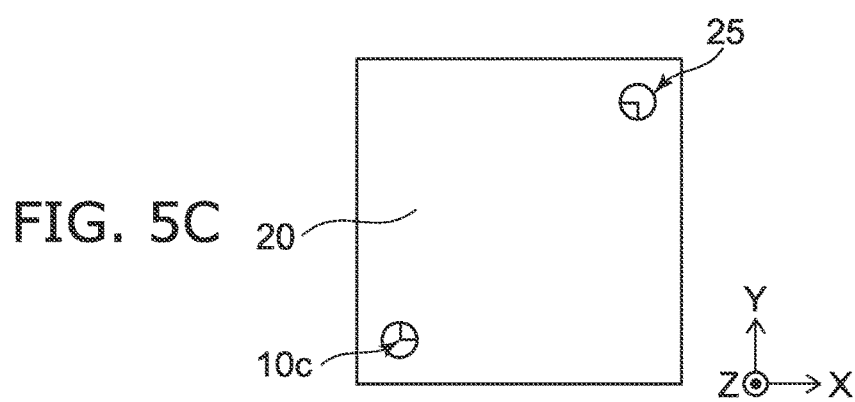

As shown in FIG. 5C, the metal plate 20 includes the through-holes 25 that are located respectively at two of the four corners of the fourth surface 4s. The metal plate 20 is provided so that two of the four corners 10c of the semiconductor chip 10 are visible via the through-holes 25 at the fourth surface 4s side. The two corners 10c that are visible via the through-holes 25 are positioned in a diagonal direction of the four corners 10c.

Figure 5D:
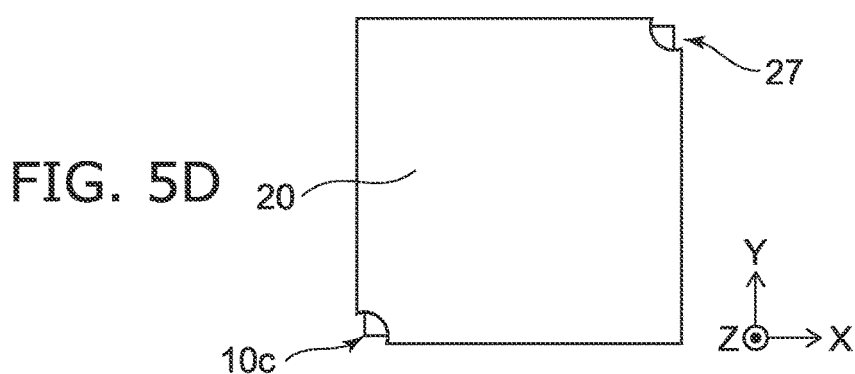

As shown in FIG. 5D, the metal plate 20 includes the notches 27 provided instead of the through-holes 25 at the two corners of the fourth surface 4s. The metal plate 20 is provided so that the two corners 10c of the semiconductor chip 10 are visible via the notches 27 at the fourth surface 4s side. The two corners 10c that are visible via the notches 27 are positioned in a diagonal direction of the four corners 10c.

Figure 6A:
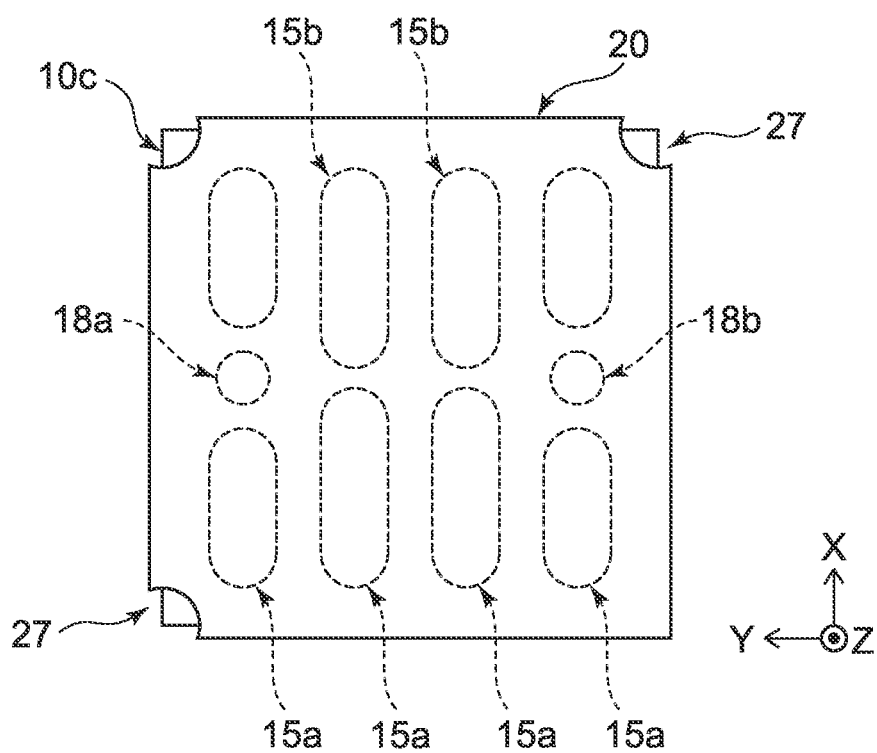
FIGS. 6A and 6B are other schematic plan views showing the semiconductor device according to modifications of the embodiment.
Figure 6B:
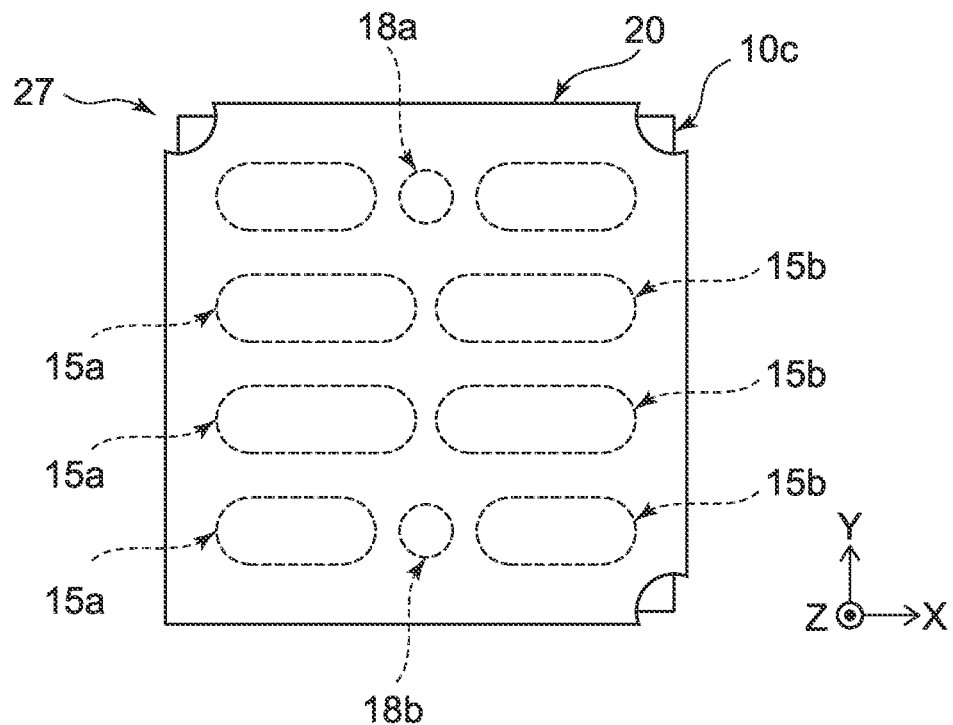

FIGS. 6A and 6B are other schematic plan views showing the semiconductor device 1 according to modifications of the embodiment. FIGS. 6A and 6B illustrate the semiconductor device 1 viewed in the fourth surface 4s side of the metal plate 20. The multiple first electrodes 15a, the multiple second electrodes 15b, a gate control pad 18a, and a gate control pad 18b that are provided at a first surface 1a side of the semiconductor chip 10 are illustrated by broken lines.

The gate control pad 18a and the gate control pad 18b are electrically connected respectively to the gate electrodes of the MOS gate structures 17a and 17b. The semiconductor device 1 controls the current that flows between the first electrode 15a and the second electrode 15b by gate signals supplied from an external gate control circuit. The gate signals are supplied via the gate control pads 18a and 18b from the external gate control circuit to the MOS gate structures 17a and 17b.

As shown in FIG. 6A, the metal plate 20 includes the notches 27 that are located respectively at three of the four corners of the fourth surface 4s. The metal plate 20 is provided so that three of the four corners 10c of the semiconductor chip 10 are visible at the fourth surface 4s side via the notches 27. The arrangement of the notches 27 is rotationally asymmetric in the metal plate 20.

FIG. 6B is a plan view showing the semiconductor device 1 which is rotated 90 degrees to the right in a plane parallel to the fourth surface 4s of the metal plate 20. Because the arrangement of the notches 27 is rotationally asymmetric in the metal plate 20, it can be known that the arrangement direction of the first electrode 15a, the second electrode 15b, the control pad 18a, and the control pad 18b at the first surface 1s side of the semiconductor chip 10 is rotated 90 degrees by checking the positions of the three notches 27.

Figure 7A:
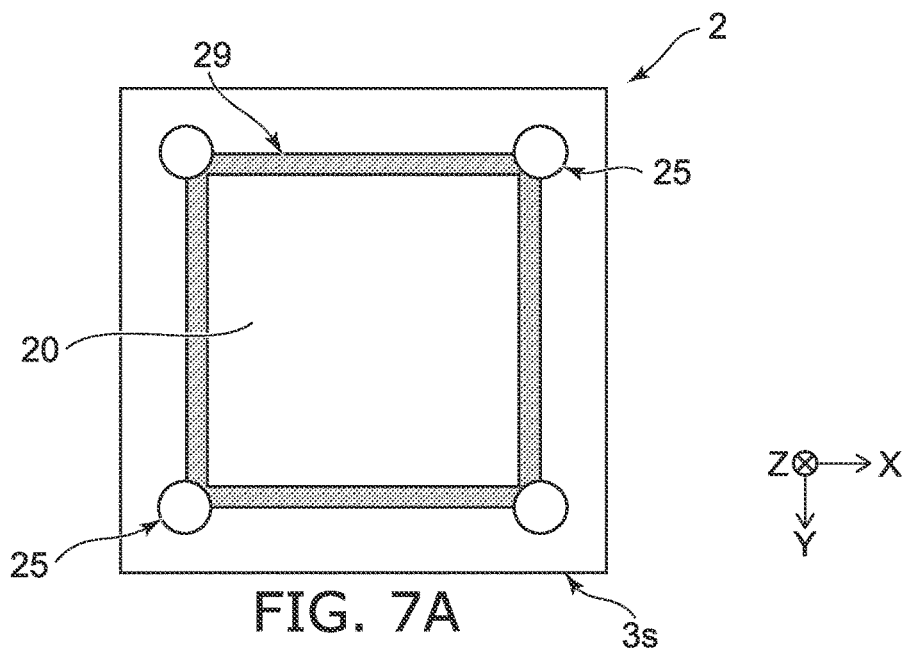
FIGS. 7A to 7C are schematic views showing a semiconductor device according to a second modification of the embodiment.
Figure 7B:
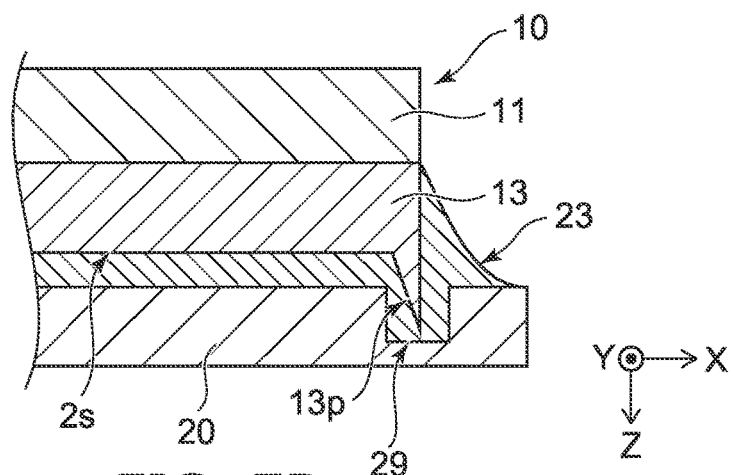
Figure 7C:
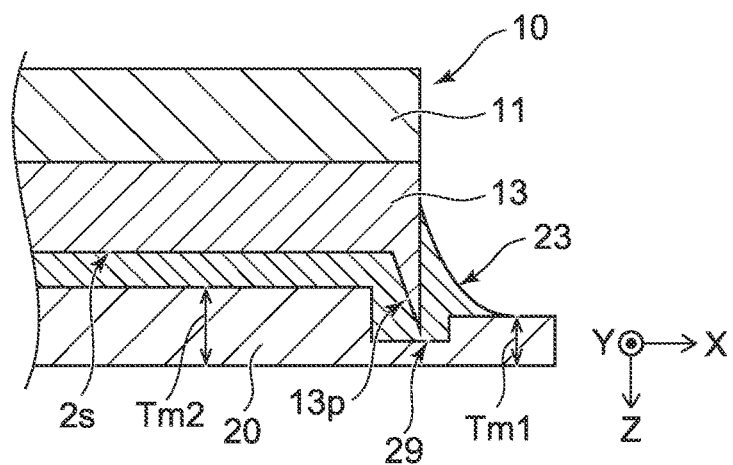

FIGS. 7A to 7C are schematic views showing a semiconductor device 2 according to a second modification of the embodiment. FIG. 7A is a plan view illustrating the third surface 3s of the metal plate 20. FIGS. 7B and 7C are partial cross-sectional views illustrating cross sections parallel to the X-Z plane.

As shown in FIG. 7A, the metal plate 20 includes, for example, four through-holes 25. The four through-holes 25 are located respectively at the four corners of the third surface 3s. The metal plate 20 further includes grooves 29 provided at the third surface 3s side. The grooves 29 are located respectively at positions corresponding to the four sides of the semiconductor chip 10. In other words, the grooves 29 each extend along the outer edge of the semiconductor chip 10 when mounting the semiconductor chip 10 on the metal plate 20 (see FIG. 2A). Thereby, the excessive portion of the connection member 23 can be received inside the groove 29; and the connection member 23 is prevented from spreading to the outer perimeter portion of the metal plate 20. The grooves 29 each communicate with the through-holes 25, for example.

As shown in FIG. 7B, there may be a case where the semiconductor chip 10 includes burr 13p at the periphery of the conductive layer 13. It is preferably for the conductive layer 13 to be thick to reduce the on-resistance between the first electrode 15a and the second electrode 15b. Therefore, when the semiconductor chip 10 is diced using a dicing blade, the burr 13p may be formed at the outer edge of the conductive layer 13.

Such burr 13p protrudes in a direction perpendicular to the second surface 2s of the semiconductor chip 10. Therefore, when the semiconductor chip 10 is mounted on the metal plate 20, a defect such as tilt of the semiconductor chip 10 may be generated, providing insufficient adhesion of the semiconductor chip 10 to the metal plate 20, etc.

In the semiconductor device 2, the grooves 29 are provided at the positions corresponding to the four sides of the semiconductor chip 10; therefore, the tip of the burr 13p can be received in the grooves 29; and the defect such as the tilt of the semiconductor chip 10 can be avoided. Thereby, the adhesion via the connection member 23 can be improved between the semiconductor chip 10 and the metal plate 20.

As shown in FIG. 7C, the metal plate 20 may have a thickness Tm1 in the Z-direction at the outer perimeter portion positioned outward of the grooves 29 and a thickness Tm2 in the Z-direction at the portion positioned inward of the grooves 29; and the thickness Tm1 is less than the thickness Tm2. Thereby, it is possible to suppress the creeping of the connection member 23 up the side surface of the semiconductor chip 10.

FIGS. 8A to 8D are schematic views showing a semiconductor device 3 according to a third modification of the embodiment. FIGS. 8A to 8D illustrate the semiconductor device 3 viewed in the fourth surface 4s side of the metal plate 20.

Figure 8A:
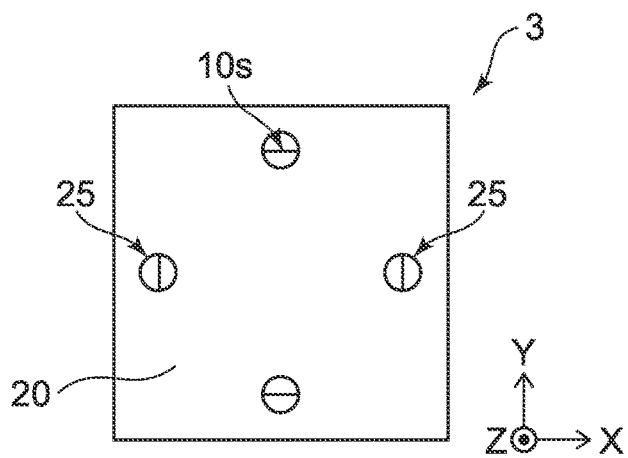
FIGS. 8A to 8D are schematic views showing a semiconductor device according to a third modification of the embodiment.

As shown in FIG. 8A, the metal plate 20 includes the four through-holes 25; and the through-holes 25 are located at positions that are proximate to the four sides of the fourth surface 4s. The metal plate 20 is provided so that the four sides of the semiconductor chip 10 are partially visible at the fourth surface 4s side via the through-holes 25. The position of the semiconductor chip 10 can be directly aligned with respect to the circuit board 30 when aligning the semiconductor device 3 above the circuit board 30. Accordingly, the misalignment of the semiconductor chip 10 can be prevented with respect to the circuit board 30.

Figure 8B:
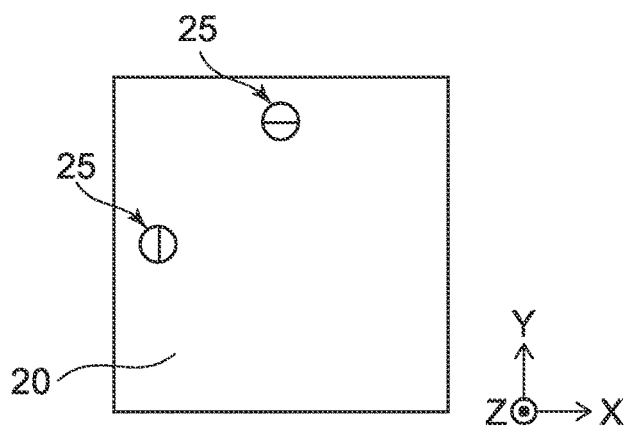

As shown in FIG. 8B, the metal plate 20 may include two through-holes 25. The through-holes 25 are located at positions that are proximate to two of the four sides of the fourth surface 4s. The metal plate 20 is provided so that two of the four sides of the semiconductor chip 10 are partially visible via the through-holes 25. Thereby, the misalignment of the semiconductor chip 10 can be prevented with respect to the circuit board 30.

Figure 8C:
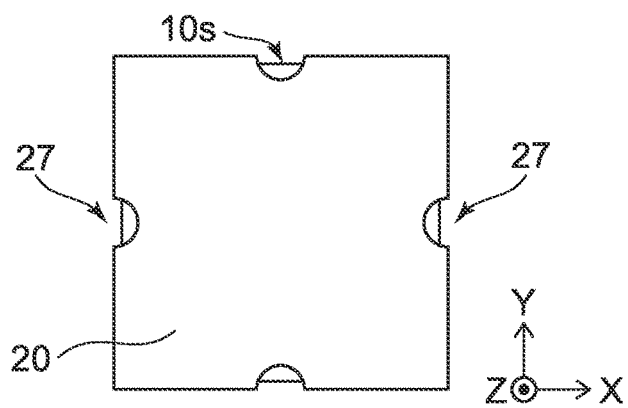

As shown in FIG. 8C, the metal plate 20 may include four notches 27 instead of the through-holes 25. The notches 27 are located respectively at the four sides of the fourth surface 4s. The metal plate 20 is provided so that the four sides of the semiconductor chip 10 are partially visible via the notches 27 at the fourth surface 4s side.

Figure 8D:
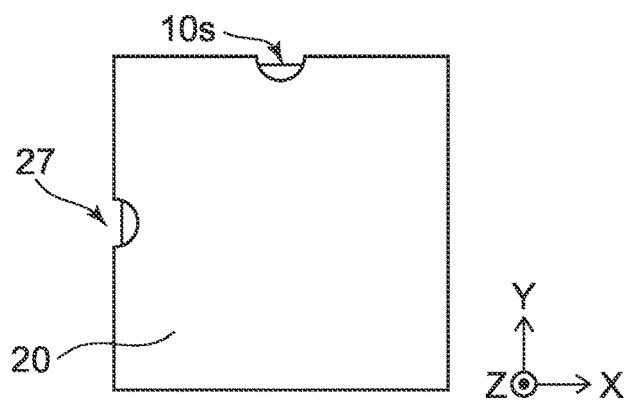

As shown in FIG. 8D, the metal plate 20 may include two notches 27. The notches 27 are located respectively at two of the four sides of the fourth surface 4s. The metal plate 20 is provided so that the two sides of the semiconductor chip 10 are partially visible via the notches 27.

Figure 9A:
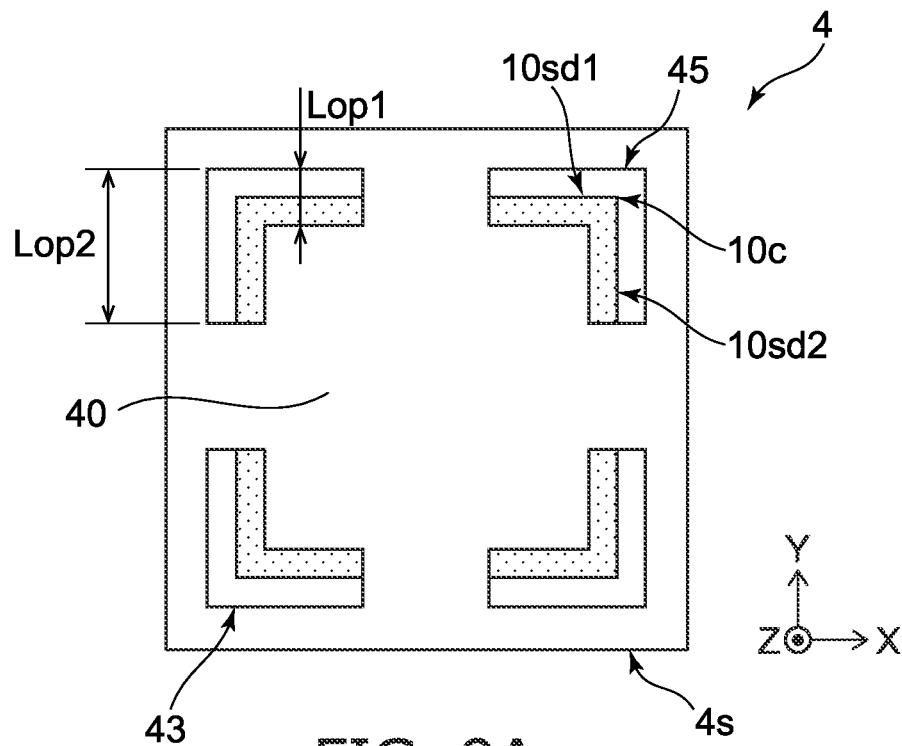
FIGS. 9A and 9B are schematic views showing a semiconductor device according to a fourth modification of the embodiment.
Figure 9B:
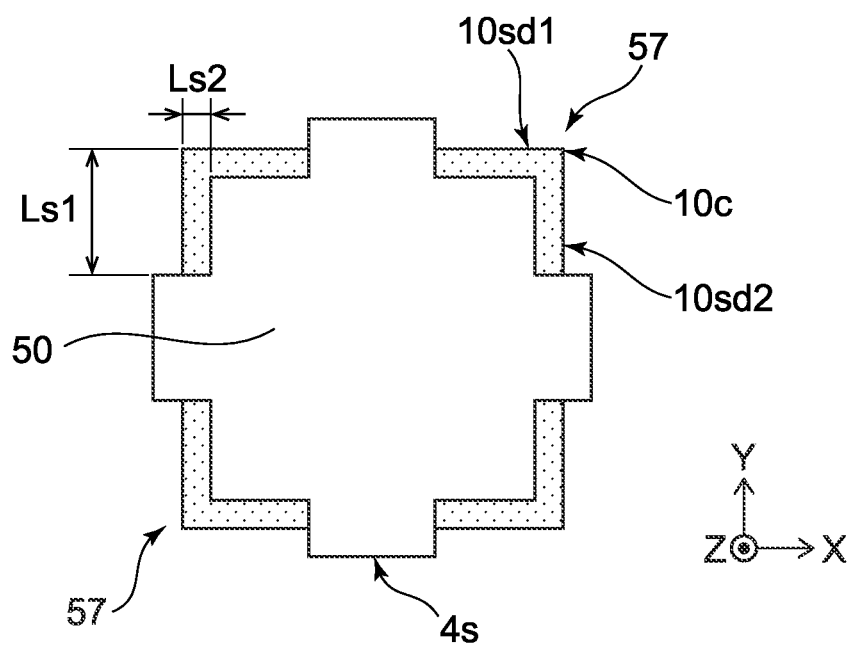

FIGS. 9A and 9B are schematic views showing a semiconductor device 4 according to a fourth modification of the embodiment. The semiconductor device 4 includes a metal plate 40 instead of the metal plate 20. FIGS. 9A and 9B illustrate the semiconductor device 4 viewed in the fourth surface 4s side of the metal plate 40.

As shown in FIG. 9A, the metal plate 40 includes, for example, four through-holes 45. The four through-holes 45 are located at the four corners of the fourth surface 4s. The metal plate 40 is provided so that one corner 10c of the semiconductor chip 10 and portions of two sides 10sd1 and 10sd2 that are connected to the one corner 10c are visible via one of the through-hole 45 at the fourth surface 4s side.

The through-hole 45 extends along the two sides 10sd1 and 10sd2. At the fourth surface 4s, the through-hole 45 has a width Lop1 and a length Lop2. The width Lop1 is defined in a direction perpendicular to each side of the semiconductor chip 10. The length Lop2 is defined along each side of the semiconductor chip 10. The width Lop1 is less than the length Lop2.

In the example, the outer edge of the semiconductor chip 10 is more clearly visible at the fourth surface 4s side. Therefore, the alignment of the semiconductor chip 10 is easier with respect to the circuit board 30.

As shown in FIG. 9B, a metal plate 50 may be used instead of the metal plate 40. The metal plate 50 includes, for example, four notches 57. The four notches 57 are located at the four corners of the fourth surface 4s. The metal plate 50 is provided so that one corner 10c of the semiconductor chip 10 and portions of the two sides 10sd1 and 10sd2 connected to the one corner 10c are visible via the notch 57 at the fourth surface 4s side.

The portion of the semiconductor chip 10 that is visible via the notch 57 has a length Ls1 and a width Ls2. The length Ls1 is defined along each side and a width Ls2 is defined in a direction perpendicular to each side. The width Ls2 is less than the length Ls1.

The examples described above are not limited to the metal plates 40 and 50. For example, the through-holes 45 or the notches 57 are not limited to four; it is sufficient for at least one of the through-hole 45 or the notch 57 to be provided in the fourth surface 4s.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor chip including first and second electrodes and a conductive layer, the semiconductor chip having a first surface, a second surface, four side surfaces, four corners, and four sides, the second surface being provided at a side opposite to the first surface, the four side surfaces connecting the first surface and the second surface, two of the four side surfaces contacting each other at one of the four corners, the four side surfaces contacting the second surface at the four sides, the first and second electrodes being provided at the first surface, and the conductive layer being provided at the second surface; and
   a metal plate connected to the second surface side of the semiconductor chip, the metal plate including a third surface, a fourth surface, and a through-hole or a notch, the third surface being connected to the second surface of the semiconductor chip, the fourth surface being provided at a side opposite to the third surface, and the through-hole or the notch extending through the metal plate from the fourth surface to the third surface,
   wherein at least two corners of the four corners of the semiconductor chip are visible via the through-hole or the notch at the fourth surface side of the metal plate.

2. The device according to claim 1, wherein the at least two corners are positioned in a diagonal direction in the first surface.

3. The device according to claim 1, wherein the metal plate includes two of the through-holes or two of the notches, and two of the four corners of the semiconductor chip are respectively visible via the two through-holes or the two notches.

4. The device according to claim 1, wherein the metal plate includes a plurality of the through-holes or the notches, and the plurality of the through-holes or the notches are rotationally asymmetric in the fourth surface of the metal plate.

5. The device according to claim 4, wherein the metal plate includes three of the through-holes or three of the notches, and three of the four corners are respectively visible via the three through-holes or the three notches.

6. The device according to claim 1, wherein:
   the semiconductor chip includes a semiconductor part, a first MOS gate structure, and a second MOS gate structure,
   the semiconductor part is provided between the conductive layer and the first electrode and between the conductive layer and the second electrode,
   the first MOS gate structure is provided between the first electrode and the semiconductor part, and
   the second MOS gate structure is provided between the second electrode and the semiconductor part.

7. The device according to claim 1, further comprising:
   a connection member provided between the semiconductor chip and the metal plate, the connection member being conductive.

8. The device according to claim 1, wherein the semiconductor chip controls a current flowing between the first electrode and the second electrode, the current flowing via the conductive layer.

9. A semiconductor device, comprising:
   a semiconductor chip including first and second electrodes and a conductive layer, the semiconductor chip having a first surface, a second surface, four side surfaces, four corners, and four sides, the second surface being provided at a side opposite to the first surface, the four side surfaces connecting the first surface and the second surface, two of the four side surfaces contacting each other at one of the four corners, the four side surfaces contacting the second surface at the four sides, the first and second electrodes being provided at the first surface, and the conductive layer being provided at the second surface; and a metal plate connected to the second surface side of the semiconductor chip, the metal plate including a third surface, a fourth surface, and a through-hole or a notch, the third surface being connected to the second surface of the semiconductor chip, the fourth surface being provided at a side opposite to the third surface, and the through-hole or the notch extending through the metal plate from the fourth surface to the third surface, wherein at least two sides of the four sides are partially visible via the through-hole or the notch at the fourth surface side of the metal plate.

10. The device according to claim 9, wherein the at least two sides are connected at the one of the four corners.

11. The device according to claim 9, wherein the metal plate includes two of the through-holes or two of the notches, and two of the four sides of the semiconductor chip are partially visible via the two through-holes or the two notches.

12. The device according to claim 9, wherein the metal plate includes a plurality of the through-holes or the notches, and the plurality of the through-holes or the notches are rotationally asymmetric in the fourth surface of the metal plate.

13. The device according to claim 12, wherein the metal plate includes three of the through-holes or three of the notches, and three of the four corners are respectively visible via the three through-holes or the three notches.

14. The device according to claim 9, wherein:
the semiconductor chip includes a semiconductor part, a first MOS gate structure, and a second MOS gate structure,
the semiconductor part is provided between the conductive layer and the first electrode and between the conductive layer and the second electrode,
the first MOS gate structure is provided between the first electrode and the semiconductor part, and
the second MOS gate structure is provided between the second electrode and the semiconductor part.

15. The device according to claim 9, further comprising:
a connection member provided between the semiconductor chip and the metal plate, the connection member being conductive.

16. The device according to claim 9, wherein the semiconductor chip controls a current flowing between the first electrode and the second electrode, the current flowing via the conductive layer.

17. A semiconductor device, comprising:
a semiconductor chip including first and second electrodes and a conductive layer, the semiconductor chip having a first surface, a second surface, four side surfaces, four corners, and four sides, the second surface being provided at a side opposite to the first surface, the four side surfaces connecting the first surface and the second surface, two of the four side surfaces contacting each other at one of the four corners, the four side surfaces contacting the second surface at the four sides, the first and second electrodes being provided at the first surface, and the conductive layer being provided at the second surface; and a metal plate connected to the second surface side of the semiconductor chip, the metal plate including a third surface, a fourth surface, and a through-hole or a notch, the third surface being connected to the second surface of the semiconductor chip, the fourth surface being provided at a side opposite to the third surface, and the through-hole or the notch extending through the metal plate from the fourth surface to the third surface, wherein the metal plate includes grooves located at the third surface side, and the grooves are provided respectively at positions corresponding to the four sides of the semiconductor chip.

18. The device according to claim 17, wherein the grooves each communicate with the through-hole.

* * * * *